(12) United States Patent
McNeal et al.

(10) Patent No.: US 8,487,613 B2
(45) Date of Patent: Jul. 16, 2013

(54) SYSTEM FOR BLOOD FLOW VELOCITY DETERMINATION USING MR IMAGING

(75) Inventors: Gary McNeal, N. Richland Hills, TX (US); Christopher Glielmi, Chicago, IL (US); Peter Weale, Chicago, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 428 days.

(21) Appl. No.: 12/951,104

(22) Filed: Nov. 22, 2010

(65) Prior Publication Data
US 2011/0175608 A1 Jul. 21, 2011

Related U.S. Application Data

(60) Provisional application No. 61/295,865, filed on Jan. 18, 2010.

(51) Int. Cl.
*G01R 33/20* (2006.01)
*G01V 3/00* (2006.01)

(52) U.S. Cl.
USPC ........... 324/306; 324/307; 324/309; 382/131; 600/419

(58) Field of Classification Search
USPC .... 324/300–322; 600/407–465; 382/128–131
See application file for complete search history.

(56) References Cited

U.S. PATENT DOCUMENTS

| | | | |
|---|---|---|---|
| 5,233,298 A * | 8/1993 | Dumoulin | 324/306 |
| 6,342,785 B1 | 1/2002 | Heid | |
| 6,507,749 B1 * | 1/2003 | Macgowan et al. | 600/419 |
| 8,000,768 B2 * | 8/2011 | Zhao et al. | 600/410 |
| 8,301,224 B2 * | 10/2012 | Kiraly | 600/410 |

OTHER PUBLICATIONS

Soo Jeong Kim, et al., "Dynamic 3-dimentional Phase-Contrast technique in MRI: Application to Complex Flow Analysis around the Artificial Heart Valve", SPIE vol. 3337, Part of the SPIE Conference on Physiology and Function from Multidimensional Images, San Diego, California, Feb. 1998.
O. Heid, "Real Time Interactive 2D Flow Quantitation", Proceedings of the 7th Scientific conference of the International Society of Magnetic Resonance in Medicine. vol. 3, p. 2007, Philadelphia, PA, USA May 22-28, 1999.
Oliver Heid, "Fourier Spliced Pencil Imaging", Institute of Diagnostic Radiology, University of Bern, CH-3010 Bern, Swizerland, VIIth ISMRM, 1999.

* cited by examiner

*Primary Examiner* — Jermele M Hollington
*Assistant Examiner* — Emily Chan
(74) *Attorney, Agent, or Firm* — Joshua B. Ryan

(57) ABSTRACT

A system improves accuracy of blood flow peak velocity measurements as well as the speed and precision of an MR data acquisition workflow. A system for blood flow velocity determination in MR imaging comprises an MR imaging system. The MR imaging system acquires a three dimensional (3D) MR imaging dataset of a patient anatomical volume of interest and a one dimensional (1D) MR imaging dataset within the volume of interest automatically aligned in response to 3D vector directional information. An image data processor derives the 3D vector directional information by, deriving velocity magnitude data using the acquired 3D MR imaging dataset, identifying maximum velocity data using the derived velocity magnitude data and transforming the identified maximum velocity data to provide the 3D vector directional information. A calculation processor uses the acquired 1D MR imaging dataset to calculate a blood flow velocity in a direction determined by the 3D vector directional information.

16 Claims, 5 Drawing Sheets

US 8,487,613 B2

SYSTEM FOR BLOOD FLOW VELOCITY DETERMINATION USING MR IMAGING

This is a non-provisional application of provisional application Ser. No. 61/295,865 filed 18 Jan. 2010, by G. McNeal et al.

FIELD OF THE INVENTION

This invention concerns a system for blood flow velocity determination in MR imaging, involving using a one dimensional (1D) MR imaging dataset and a three dimensional (3D) MR imaging dataset to calculate a blood flow velocity.

BACKGROUND OF THE INVENTION

Phase-contrast magnetic resonance image data acquisition with velocity-encoding provides cardiovascular flow visualization and quantification of severity of stenosis by evaluating a peak blood flow velocity within a core of a post-stenotic jet. However, this method often underestimates peak velocity of flow jets due in part to reliance on subjective alignment of a velocity-encoding axis employed by a pulse sequence used for MR data acquisition, with the principle axis of the jet, and also due in part to using insufficient temporal resolution when sampling blood flow data. Manual alignment of these axes may be difficult, particularly as post-stenotic jets frequently exhibit a degree of eccentricity and can change direction throughout a cardiac cycle. Obtaining sufficiently high temporal resolution in MR image data acquisition is difficult, particularly as lower temporal resolution multi-dimensional phase-contrast pulse sequences are typically used to derive the flow information.

Known systems employ phase-contrast pulse sequences to acquire MR image data having two-dimensional spatial-encoding and three-dimensional velocity-encoding through a flow jet and perform pixel-wise root-sum-of-squares calculations to generate a two-dimensional velocity magnitude map. Visual inspection of a velocity magnitude map is used to manually guide the location, orientation, and velocity-encoding-sensitivity-factor (VENC) of a subsequent phase-contrast pulse sequence having two-dimensional spatial-encoding and single-dimensional velocity-encoding in the through-plane direction. The known systems are inaccurate for reasons including, 1) the locations and orientations of the two-dimensional slices are inaccurate due to operator dependence, 2) the VENC's of the two-dimensional slices are sub-optimal due to operator dependence, and 3) the temporal resolution of the two-dimensional slices are insufficient due to the use of multi-dimensional encoding. Known systems are time-consuming and it is often necessary to repeat image data acquisition and analysis when the operator choices are initially suboptimal. A system according to invention principles addresses these problems and related problems.

SUMMARY OF THE INVENTION

A system provides automatic and precise alignment of a velocity-encoding axis of a real-time single-dimensional phase-contrast sequence with a principle axis of a blood flow jet, improving the accuracy of peak velocity measurements as well as the speed and precision of an MR data acquisition workflow. A system for blood flow velocity determination in MR imaging comprises an MR imaging system. The MR imaging system acquires a three dimensional (3D) MR imaging dataset of a patient anatomical volume of interest and a one dimensional (1D) MR imaging dataset within the volume of interest automatically aligned in response to 3D vector directional information. An image data processor derives the 3D vector directional information by, deriving velocity magnitude data using the acquired 3D MR imaging dataset, identifying maximum velocity data using the derived velocity magnitude data and transforming the identified maximum velocity data to provide the 3D vector directional information. A calculation processor uses the acquired 1D MR imaging dataset to calculate a blood flow velocity in a direction determined by the 3D vector directional information.

DETAILED DESCRIPTION OF THE INVENTION

A system provides automatic accurate alignment of a velocity-encoding axis of a real-time single-dimensional phase-contrast sequence with a principle axis of a blood flow jet, improving the accuracy of peak velocity measurements as well as the speed and precision MR image data acquisition. In one embodiment the system provides an optimized workflow for accurate determination of peak velocity in blood flow jets using vector analysis of phase-contrast data having multiple spatial-encoding dimensions and multiple velocity-encoding dimensions to automatically and precisely align a velocity-encoding axis of a real-time single-dimensional phase-contrast sequence with the principle axis of the flow jet. The system automatically identifies real-time single-dimensional phase-contrast data in an optimal location and orientation to clinically assess blood flow jets from intra-cardiac valve pathologies such as stenosis and regurgitation, vascular pathologies such as coarctations and surgical repairs such as baffles and shunts. The system addresses the problem of underestimation of peak velocity of blood flow jets in phase-contrast magnetic resonance data acquisition due in part to reliance on subjective alignment of a pulse sequence velocity-encoding axis with the principle axis of the flow jet.

The system improves accuracy of blood flow peak velocity measurement by removing operator dependence when specifying the location, orientation, and velocity-encoding-sensitivity-factor (VENC) of a velocity measurement. The system automatically extracts data indicating optimal location, orientation, and VENC from a multi-dimensional measurement and automatically applies this information to a real-time single-dimensional measurement. An imaging examination workflow, data acquisition speed, ease, and repeatability are improved due to automated guidance of the single-dimensional measurement. The one dimensional acquisition, provides higher temporal resolution and the combination of identification of location and orientation of the peak velocity via the 3D encoded, but low temporal resolution data, and the rapid, error free positioning of the 1D data (lacking in spatial information but with improved temporal resolution), provides improved accuracy in the assessment of peak velocities using Magnetic Resonance Imaging.

Figure 1:
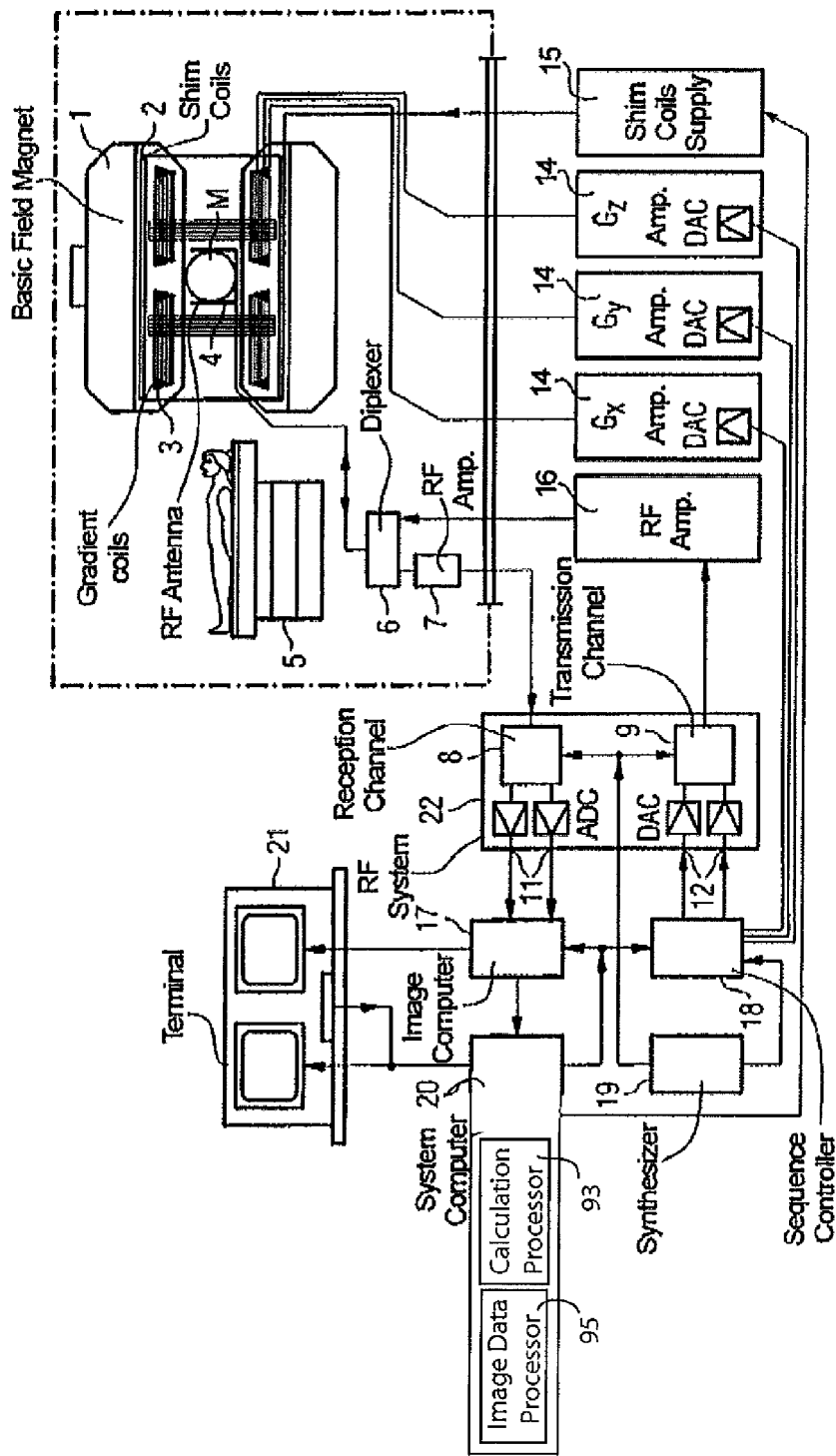
FIG. 1 shows an MR imaging unit including a system for blood flow velocity determination, according to invention principles.

FIG. 1 shows MR imaging system 10 including a system for blood flow velocity determination. A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient, Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

System computer 20 including image data processor 95 and calculation processor 93, automatically (or in response to user command entered via terminal 21) employs and directs the MR imaging device of system 10 in blood flow velocity determination. MR imaging system 10 acquires a three dimensional (3D) MR imaging dataset of a patient anatomical volume of interest and a one dimensional (1D) MR imaging dataset within the volume of interest automatically aligned in response to 3D vector directional information. Image data processor 95 derives the 3D vector directional information by, deriving velocity magnitude data using the acquired 3D MR imaging dataset, identifying maximum velocity data using the derived velocity magnitude data and transforming the identified maximum velocity data to provide the 3D vector directional information. Calculation processor 93 uses the acquired 1D MR imaging dataset to calculate a blood flow velocity in a direction determined by the 3D vector directional information. An image generator of imaging computer 17 generates an MR image using an acquired MR image dataset for display on a reproduction device (e.g., terminal 21).

Figure 2:
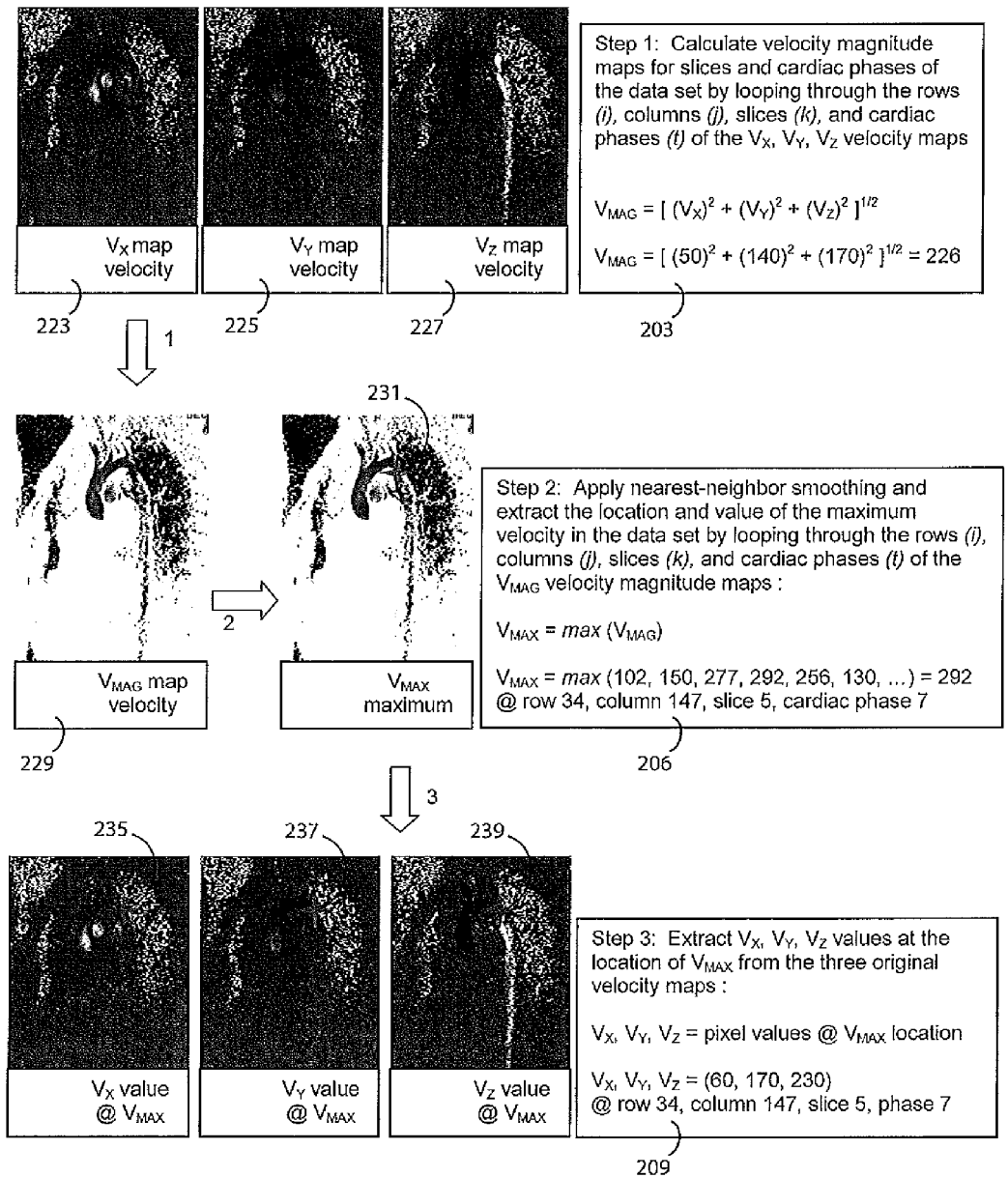
FIGS. 2 and 3 show a flowchart of a process and associated image sequence used for calculating a blood flow velocity in a direction determined by the 3D vector directional information, according to invention principles.
Figure 3:
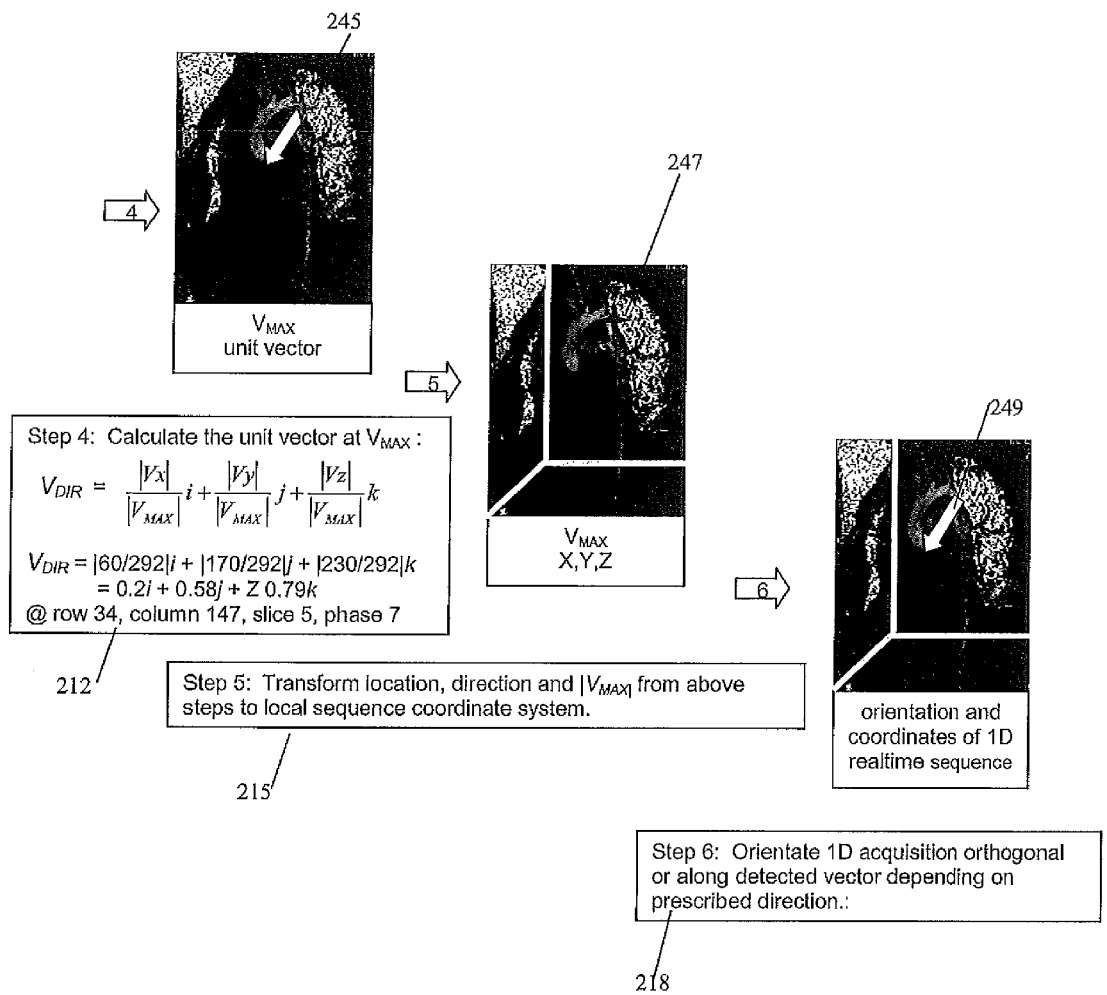

FIGS. 2 and 3 show a flowchart of a process and associated image sequence used by system 10 (FIG. 1) for calculating a blood flow velocity in a direction determined by the 3D vector directional information. In step 203 a velocity magnitude map is derived by image data processor 95 by applying a pixel-wise root-sum-of squares calculation to a phase contrast dataset acquired with two or three dimensional spatial-encoding and 3-dimensional velocity-encoding, such that $V_{MAG}=(V_x^2+V_y^2+V_z^2)^{1/2}$, (for example, $V_{MAG}=(50^2+140^2+170^2)^{1/2}=226$). Image data processor 95 calculates velocity magnitude maps for slices and cardiac phases of a 3D dataset by looping through rows (i), columns (j), slices (k) and cardiac phases (t) of $V_X$ 223, $V_Y$ 225, $V_Z$ 227, velocity maps derived from an acquired 3D image dataset. In step 206, image data processor 95 applies pixel-wise nearest neighbor smoothing to a calculated velocity magnitude map 229 in calculating a maximum velocity magnitude and its unit vector. Image data processor 95 extracts the location and value of the maximum velocity 231 in the dataset by looping through rows (i), columns (j), slices (k) and cardiac phases (t) of the $V_{MAG}$ velocity magnitude maps. Specifically, processor 95 calculates location (x, y, z), direction ($V_X$, $V_Y$, $V_Z$) and magnitude ($V_{MAX}$=max ($V_{MAG}$)). For example, $V_{MAX}$=max (102, 150, 277, 292, 130 . . . )=292 at row 34, column 147, slice 5 cardiac phase 7.

In step 209 image data processor 95 extracts $V_X$, $V_Y$, $V_Z$ velocity components of $V_{MAX}$ at the locations 235, 237 and 239 of $V_{MAX}$ 231 from the three original velocity maps 223, 225 and 227. Specifically, $V_X$, $V_Y$, $V_Z$=pixel values at the $V_{MAX}$ location, $V_X$, $V_Y$, $V_Z$=(60, 170, 230) at row 34, column 147, slice 5, phase 7. The determined $V_X$, $V_Y$, $V_Z$ velocity values of $V_{MAX}$ improve the accuracy of peak velocity measurements in blood flow jets by ensuring that a velocity-sampling beam of a 1D flow sequence is precisely guided along the core axis of the jet, thereby ensuring that the maximal velocity components within the jet are sampled. In contrast in known systems, guidance of the velocity-sampling beam is provided interactively by the operator, and thus the guidance is prone to human error and the determined peak velocity is less likely to be accurately sampled.

In step 212, image data processor 95 calculates a unit vector 245 at $V_{MAX}$, $$V_{DIR} = \frac{|Vx|}{|V_{MAX}|}i + \frac{|Vy|}{|V_{MAX}|}j + \frac{|Vz|}{|V_{MAX}|}k$$

Specifically, $V^{DIR}$=|60/292|i+|170/292|j+|230/292|k=0.2i+0.58j+0.79 k at row 34, column 147, slice 5, phase 7, for example. Image data processor 95 in step 215 extracts slice orientation, slice position, row, and column data to transform into a local sequence coordinate system. In step 218, processor 95 provides the calculated data for subsequent 1D real-time flow sequence calculation by calculation processor 93. This orientates a 1D acquisition orthogonally or along a detected vector depending on prescribed direction. The vector attributes of $V_{MAX}$ are automatically employed in determining a high temporal resolution phase-contrast pulse sequence with 1-dimensional velocity-encoding along the axis of the flow jet 249 used for acquiring MR image data. The $V_{MAX}$ vector direction and position are referenced to the X,Y,Z axis of the MR scanner and subsequent MR scans use the same co-ordinate system facilitating conversion of a derived vector in image space to a scan orientation and location.

Figure 4:
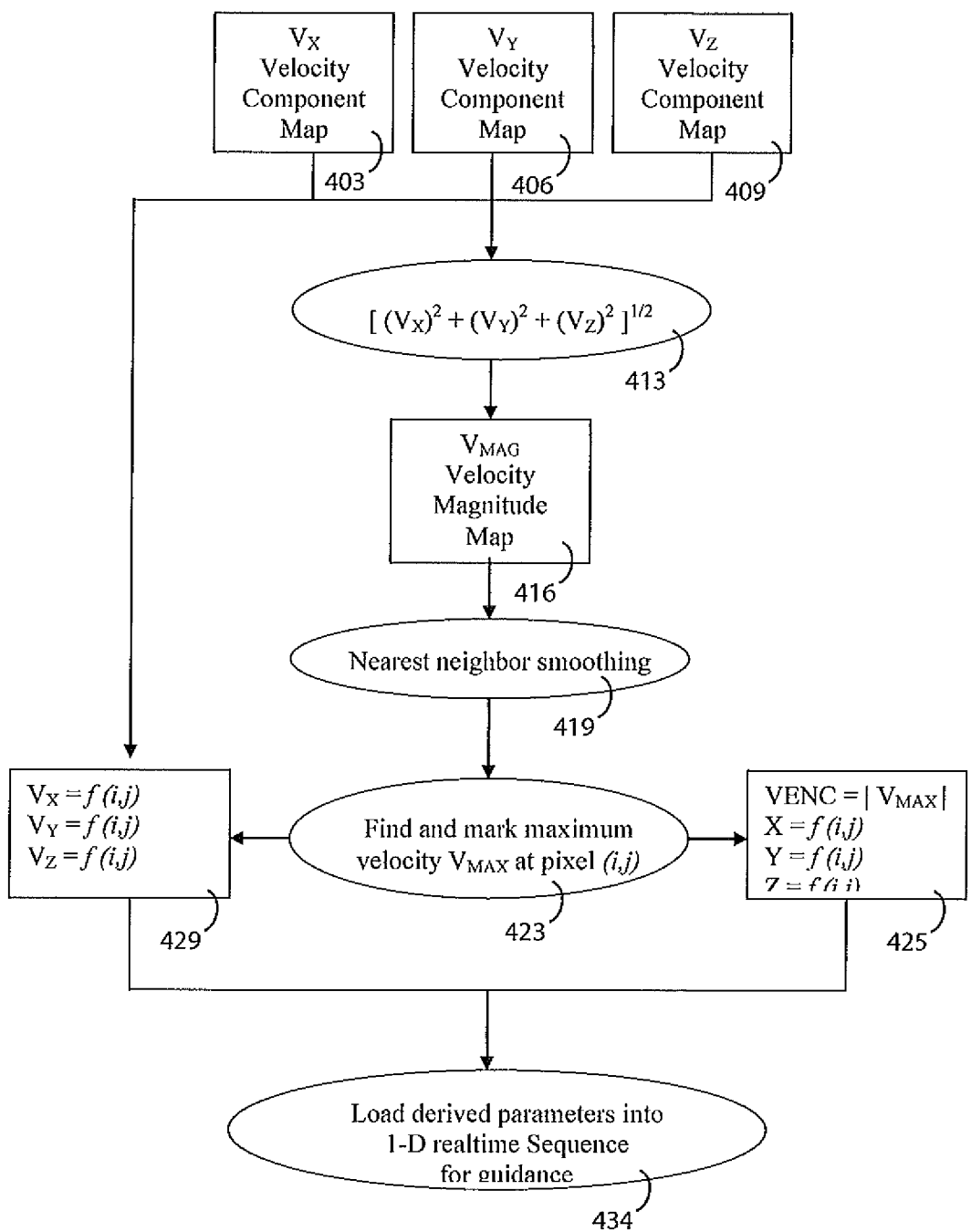
FIG. 4 shows a flowchart of a process for determining a maximum velocity of blood flow from velocity component maps derived by MR imaging, according to invention principles.

FIG. 4 shows a flowchart of a process for determining a maximum velocity of blood flow from velocity component maps derived by MR imaging. System 10 calculates $V_{MAG}$= $(V_X^2+V_Y^2+V_Z^2)^{1/2}$ in step 413 from individual elements of $V_X$, $V_Y$, $V_Z$ velocity component maps 403, 406 and 409 respectively to provide a velocity magnitude map in step 416. In step 419, image data processor 95 applies pixel-wise nearest neighbor smoothing to the calculated velocity magnitude map in calculating a maximum velocity magnitude at a pixel (i,j) in step 423. Image data processor 95 in step 429 extracts $V_X$, $V_Y$, $V_Z$ velocity components of the maximum velocity magnitude at a pixel (i,j) from the three original velocity maps (403, 406, 409). In step 425 processor 95 determines x, y, z location coordinates of $V_{MAX}$ at pixel (i,j) and determines VENC (=magnitude of $V_{MAX}$). In step 434, processor 95 provides attributes of $V_{MAX}$ comprising, orientation (=unit vector direction $V_x$, $V_y$, $V_z$ velocity components of $V_{MAX}$) location (=x, y, z coordinates of $V_{MAX}$) and VENC (=magnitude of $V_{MAX}$) for subsequent 1D real-time flow sequence calculation by calculation processor 93.

In one embodiment a calculated orientation of the vector is used to dynamically update orientation of the 1D (or pencil beam) acquisition during a cardiac cycle so that a blood flow jet may be tracked during the cardiac cycle. This advantageously accommodates a time varying jet orientation. In this embodiment, a 3D Velocity encoded sequence has a resolution time (incremental acquisition time interval) of x milliseconds (ms). The system calculates a velocity vector for each x ms step. For a 1D data acquisition having higher time resolution (e.g., x/10 ms), system 10 (FIG. 1) calculates an interpolated vector orientation for each of the x/10 ins steps. This interpolated velocity vector is used to re-orientate the 1D (or pencil beam) acquisition throughout a cardiac cycle and the 1D data acquisition is synchronized with an ECG signal.

Figure 5:
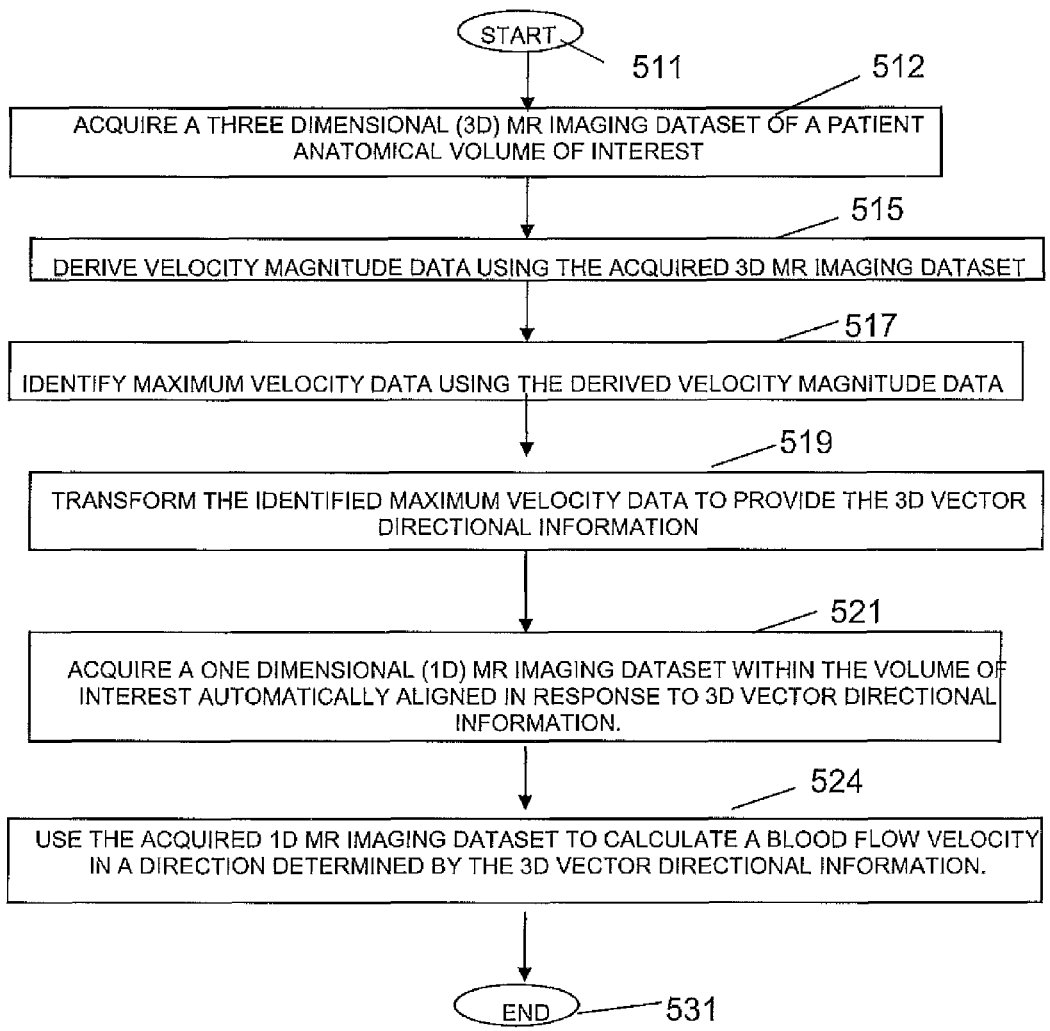
FIG. 5 shows a flowchart of a process performed by a system for blood flow velocity determination in MR imaging, according to invention principles.

FIG. 5 shows a flowchart of a process performed by system 10 for blood flow velocity determination in MR imaging. In step 512 following the start at step 511, system 10 (FIG. 1) acquires a three dimensional (3D) MR imaging dataset of a patient anatomical volume of interest using 2D slice image acquisitions. Image data processor 95 derives 3D vector directional information in steps 515, 517 and 519. Image data processor in step 515 derives velocity magnitude data using the acquired 3D MR imaging dataset and in step 517 identifies maximum velocity data using the derived velocity magnitude data. Image data processor 95 identifies the maximum velocity data by processing the acquired 3D MR imaging dataset to provide a 3D velocity magnitude map of blood flow in the volume of interest and uses the map in identifying maximum velocity data of the velocity magnitude data. Image data processor 95 applies pixel-wise nearest neighbor smoothing to the derived velocity magnitude data in calculating a maximum velocity magnitude and the 3D vector directional information. Image data processor 95 identifies a maximum velocity vector using the maximum velocity data and transforms the identified maximum velocity data to provide the 3D vector directional information by transforming data representing one or more of, orientation, slice position, row and column at the coordinates of the maximum velocity vector to provide Cartesian coordinates of the maximum velocity vector. In one embodiment, image data processor 95 derives the 3D velocity magnitude data $V_{MAG}$ using a function of the form, $$V_{MAG}=(V_X^2+V_Y^2+V_Z^2)^{1/2},$$

where $V_X$, $V_Y$, $V_Z$ are velocity components in x, y, z Cartesian coordinate directions.

In step 519 image data processor 95 transforms the identified maximum velocity data to provide the 3D vector directional information (comprising a direction vector, for example). Image data processor 95 uses one or more of, (a) the Cartesian coordinates of the maximum velocity vector, (b) the velocity components of the maximum velocity vector and (c) the magnitude of the maximum velocity vector, to derive a pulse sequence for acquiring a 1D MR imaging dataset using the MR imaging system. In step 521 image data processor 95 acquires a one dimensional (1D) MR imaging dataset within the volume of interest automatically aligned in response to the 3D vector directional information. In one embodiment, image data processor 95 determines the 3D vector directional information over multiple individual time increments of the cardiac cycle and interpolates orientation of the one dimensional (1D) MR imaging dataset for individual time increments of the multiple individual time increments. Calculation processor 93 in step 524 uses the acquired 1D MR imaging dataset to calculate a blood flow velocity in a direction determined by the 3D vector directional information. Image data processor 95 uses the 3D vector directional information to dynamically update orientation of the one dimensional (1D) MR imaging dataset acquisition during a cardiac cycle so that a blood flow jet may be tracked during the cardiac cycle. The process of FIG. 5 terminates at step 531.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-5 are not exclusive. Other systems and processes may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system advantageously uses a maximum velocity vector $V_{MAX}$ to consistently and automatically guide acquisition of a real-time single-dimensional velocity measurement. The system is usable to clinically assess blood flow jets from intra-cardiac valve pathologies such as stenosis and regurgitation, vascular pathologies such as coarctations, surgical repairs such as baffles and shunts, and wall shear effects due to vortices in aneurysmal blood vessels and cardiac chambers. Further, the processes and applications may, in alternative embodiments, be located on one or more (e.g., distributed) processing devices on a network linking the units of FIG. 1. Any of the functions, image controls and steps provided in FIGS. 1-5 may be implemented in whole or in part in hardware, software or a combination of both.

What is claimed is:

1. A system for blood flow velocity determination in MR imaging, comprising:
   an MR imaging system for acquiring,
      a three dimensional (3D) MR imaging dataset of a patient anatomical volume of interest and
      a one dimensional (1D) MR imaging dataset within the volume of interest and
      automatically aligning the 1D MR imaging dataset in response to 3D vector directional information;
   an image data processor for deriving said 3D vector directional information by,
      deriving velocity magnitude data using the acquired 3D MR imaging dataset,
      identifying maximum velocity data using the derived velocity magnitude data and
      transforming the identified maximum velocity data to provide said 3D vector directional information; and
   a calculation processor for using the acquired 1D MR imaging dataset to calculate a blood flow velocity in a direction determined by the 3D vector directional information.

2. A system according to claim 1, wherein
said image data processor identifies said maximum velocity data by,
   processing the acquired 3D MR imaging dataset to provide velocity magnitude data of blood flow in said volume of interest and
   identifying maximum velocity data of the velocity magnitude data.

3. A system according to claim 1, wherein
said image data processor identifies said maximum velocity data by processing the acquired 3D MR imaging dataset to provide a 3D velocity magnitude map of blood flow in said volume of interest and uses said map in identifying maximum velocity data of the velocity magnitude data.

4. A system according to claim 1, wherein
said MR imaging system acquires said three dimensional (3D) MR imaging dataset using 2D slice image acquisitions.

5. A system according to claim 1, wherein
said image data processor uses said 3D vector directional information to dynamically update orientation of the one dimensional (1D) MR imaging dataset acquisition during a cardiac cycle so that a blood flow jet may be tracked during the cardiac cycle.

6. A system according to claim 5, wherein
said image data processor determines said 3D vector directional information over a plurality of individual time increments of the cardiac cycle and interpolates orientation of the one dimensional (1D) MR imaging dataset for individual time increments of said plurality of individual time increments.

7. A system according to claim 1, wherein
said image data processor applies pixel-wise nearest neighbor smoothing to the derived velocity magnitude data in calculating a maximum velocity magnitude and said 3D vector directional information.

8. A system according to claim 1, wherein
said 3D vector directional information comprises a direction vector.

9. A system according to claim 1, wherein
said image data processor derives the 3D velocity magnitude data $V_{MAG}$ using a function of the form, $$V_{MAG} = (V_X^2 + V_Y^2 + V_Z^2)^{1/2},$$

where $V_X$, $V_Y$, $V_Z$ are velocity components in x, y, z Cartesian coordinate directions.

10. A system for blood flow velocity determination in MR imaging, comprising:
an MR imaging system for acquiring,
  a three dimensional (3D) MR imaging dataset of a patient anatomical volume of interest and
  a one dimensional (1D) MR imaging dataset within the volume of interest automatically aligned in response to 3D vector directional information by,
an image data processor for deriving said 3D vector directional information by,
  deriving velocity magnitude data using the acquired 3D MR imaging dataset,
  identifying maximum velocity data using the derived velocity magnitude data and
  transforming the identified maximum velocity data to provide said 3D vector directional information; and
a calculation processor for using the acquired 1D MR imaging dataset to calculate a blood flow velocity in a direction determined by the 3D vector directional information, wherein
said image data processor identifies said maximum velocity data by,
  processing the acquired 3D MR imaging dataset to provide velocity magnitude data of blood flow in said volume of interest,
  identifying maximum velocity data of the velocity magnitude data and
identifies a maximum velocity vector using said maximum velocity data and transforms the identified maximum velocity data to provide said 3D vector directional information by transforming data representing one or more of, orientation, slice position, row and column at the coordinates of the maximum velocity vector to provide Cartesian coordinates of the maximum velocity vector.

11. A system according to claim 10, wherein
said image data processor uses one or more of,
  (a) the Cartesian coordinates of the maximum velocity vector,
  (b) the velocity components of the maximum velocity vector and
  (c) the magnitude of the maximum velocity vector,
to derive a pulse sequence for acquiring the 1D MR imaging dataset using the MR imaging system.

12. A method for blood flow velocity determination in MR imaging using an MR imaging device, comprising the activities of:
acquiring a three dimensional (3D) MR imaging dataset of a patient anatomical volume of interest;
deriving 3D vector directional information by,
  deriving velocity magnitude data using the acquired 3D MR imaging dataset,
  identifying maximum velocity data using the derived velocity magnitude data and
  transforming the identified maximum velocity data to provide said 3D vector directional information; and
acquiring a one dimensional (1D) MR imaging dataset within the volume of interest and automatically aligning the 1D MR imaging dataset in response to said 3D vector directional information.

13. A method according to claim 12, including the activity of
using the acquired 1D MR imaging dataset to calculate a blood flow velocity in a direction determined by the 3D vector directional information.

14. A method according to claim 12, including the activity of
identifying said maximum velocity data by,
  processing the acquired 3D MR imaging dataset to provide velocity magnitude data of blood flow in said volume of interest and
  identifying maximum velocity data of the velocity magnitude data.

15. A system for blood flow velocity determination in MR imaging, comprising:
an MR imaging system for acquiring,
  a three dimensional (3D) MR imaging dataset of a patient anatomical volume of interest and
  a one dimensional (1D) MR imaging dataset within the volume of interest and
automatically aligning the 1D MR imaging dataset in response to 3D vector directional information;
an image data processor for deriving said 3D vector directional information by,
  deriving velocity magnitude data using the acquired 3D MR imaging dataset,
  identifying maximum velocity data using the derived velocity magnitude data,
  transforming the identified maximum velocity data to provide said 3D vector directional information and
  deriving a pulse sequence for acquiring the (1D) MR imaging dataset using the MR imaging system; and
a calculation processor for using the acquired 1D MR imaging dataset to calculate a blood flow velocity in a direction determined by the 3D vector directional information.

16. A system according to claim 15, wherein
said image data processor derives said pulse sequence for acquiring the (1D) MR imaging dataset using the MR imaging system using one or more of,
  (a) the Cartesian coordinates of the maximum velocity vector,
  (b) the velocity components of the maximum velocity vector and
  (c) the magnitude of the maximum velocity vector.

* * * * *